(12) United States Patent
Hung et al.

(10) Patent No.: US 11,638,379 B2
(45) Date of Patent: Apr. 25, 2023

(54) METHOD FOR FORMING MEMORY DEVICE

(71) Applicant: MACRONIX INTERNATIONAL CO., LTD., Hsinchu (TW)

(72) Inventors: Min-Feng Hung, Hsin-Chu (TW); Chia-Jung Chiu, Hsin-Chu (TW); Guan-Ru Lee, Hsin-Chu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 17/511,829

(22) Filed: Oct. 27, 2021

(65) Prior Publication Data

US 2022/0052072 A1    Feb. 17, 2022

Related U.S. Application Data

(62) Division of application No. 16/412,596, filed on May 15, 2019, now Pat. No. 11,195,847.

(51) Int. Cl.

| H10B 43/20 | (2023.01) |
| H01L 29/417 | (2006.01) |
| H01L 21/762 | (2006.01) |

(52) U.S. Cl.
CPC ....... *H10B 43/27* (2023.02); *H01L 21/76224* (2013.01); *H01L 29/41741* (2013.01)

(58) Field of Classification Search
CPC ............... H01L 27/11582; H01L 21/76; H01L 21/76224; H01L 29/41741; H01L 27/11575; H01L 27/11565; H01L 27/11521; H01L 27/11551; H01L 27/11568; H01L 27/11578; H10B 43/27; H10B 43/10; H10B 43/50; H10B 41/30; H10B 41/20; H10B 43/20; H10B 43/30
See application file for complete search history.

(56) References Cited

U.S. PATENT DOCUMENTS

| 9,748,264 B1 | 8/2017 | Jiang et al. |
| 2010/0178759 A1* | 7/2010 | Kim ............... H01L 29/7881 257/E21.21 |
| 2010/0207194 A1 | 8/2010 | Tanaka et al. |
| 2015/0129878 A1 | 5/2015 | Shin |
| 2015/0145015 A1 | 5/2015 | Shin et al. |
| 2016/0225785 A1 | 8/2016 | Kim et al. |
| 2016/0293627 A1* | 10/2016 | Kim ............... H01L 27/11582 |
| 2017/0033044 A1* | 2/2017 | Choi ............... H01L 27/11582 |
| 2017/0287928 A1 | 10/2017 | Kanamori et al. |

(Continued)

*Primary Examiner* — Shahed Ahmed
*Assistant Examiner* — Khatib A Rahman
(74) *Attorney, Agent, or Firm* — McClure, Qualey & Rodack, LLP

(57) ABSTRACT

A method for forming a memory device is provided. The memory device includes a substrate; a stack including a plurality of conductive layers and a plurality of insulating layers being alternatively stacked on the substrate; a plurality of memory structures formed on the substrate and penetrating the stack; a plurality of isolation structures formed on the substrate and penetrating the stack, wherein the isolation structures dividing the memory structures into a plurality of first memory structures and a plurality of second memory structures; and a plurality of common source pillars formed on the substrate and penetrating the stack, wherein the common source pillars directly contact the isolation structures.

9 Claims, 20 Drawing Sheets

(56) References Cited

U.S. PATENT DOCUMENTS

2017/0309635 A1  10/2017  Kim et al.
2018/0254284 A1   9/2018  Hwang et al.
2019/0027491 A1   1/2019  Lee et al.

* cited by examiner

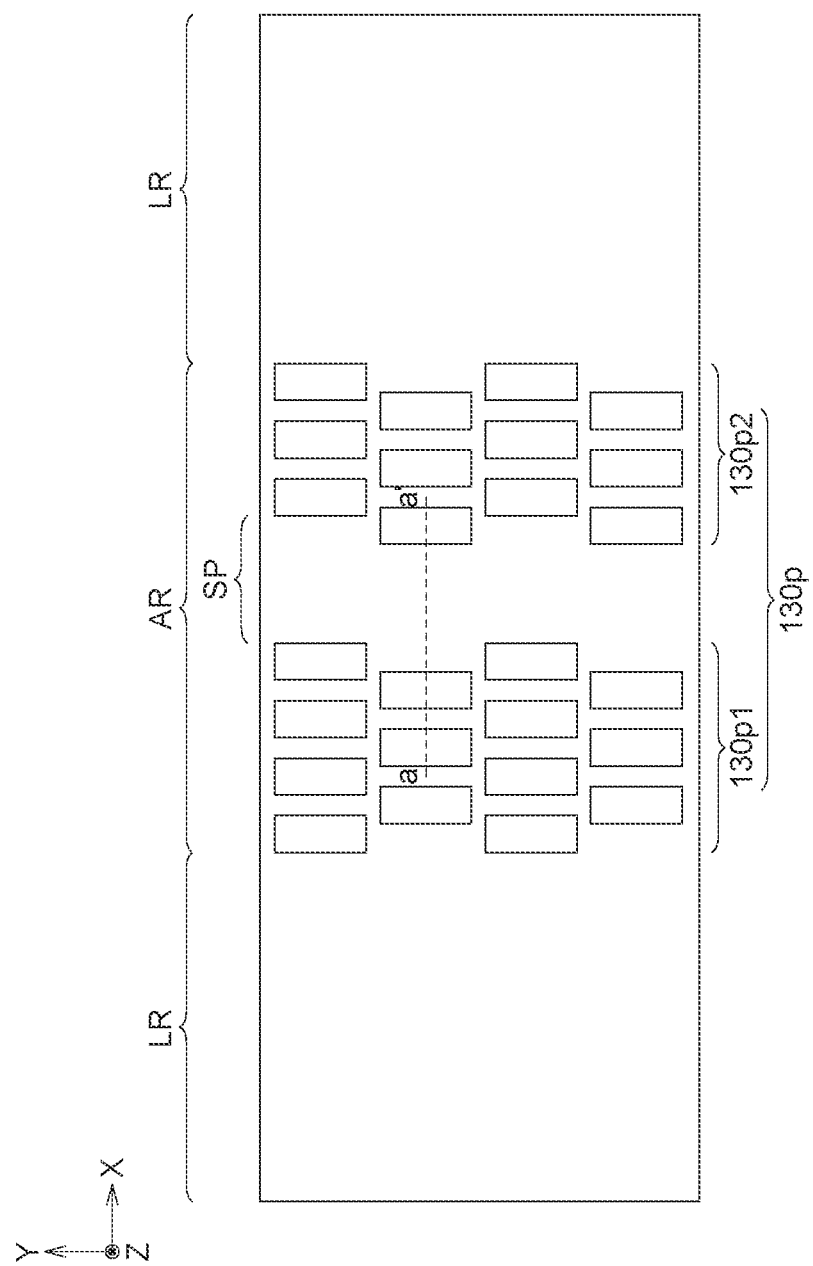

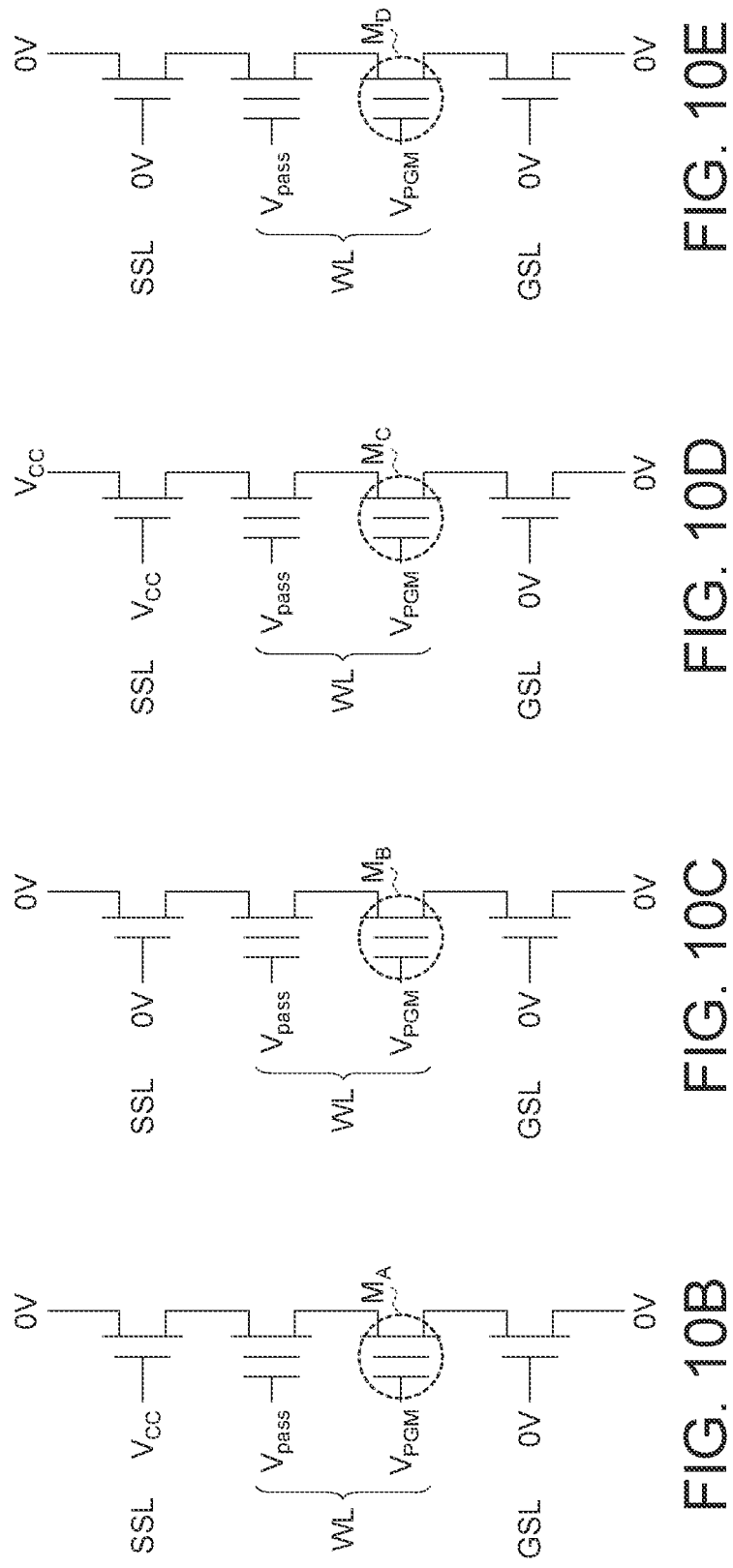

METHOD FOR FORMING MEMORY DEVICE

The application is a divisional application of U.S. patent application Ser. No. 16/412,596, filed on May 15, 2019, now U.S. Pat. No. 11,195,847, the subject matter of which is incorporated herein by reference.

BACKGROUND OF THE INVENTION

Field of the Invention

The invention in generally relates to a method for forming a memory device, and more particularly to a method for forming a three dimensional (3D) memory device.

Description of the Related Art

The 3D memory devices, such as a 3D non-volatile memory (NVM) which has a multi-layer stack structure may possess a higher density memory and excellent electrical characteristics, e.g. reliability in data storage and high operating speed, has been provided in order to accommodate the rising demand for superior memory.

However, as the application increases, there is still a need of providing a memory device with an improved performance while increasing the memory density.

SUMMARY OF THE INVENTION

The invention is directed to a memory device and a method for forming the same. In the present invention, first memory structures and second memory structures are separated by isolation structures directly contacting common source pillars. Therefore, the memory density in a unit area is increased, and the array efficiency is improved.

According to an embodiment of the present invention, a memory device includes a substrate; a stack including a plurality of conductive layers and a plurality of insulating layers being alternatively stacked on the substrate; a plurality of memory structures formed on the substrate and penetrating the stack; a plurality of isolation structures formed on the substrate and penetrating the stack, wherein the isolation structures dividing the memory structures into a plurality of first memory structures and a plurality of second memory structures; and a plurality of common source pillars formed on the substrate and penetrating the stack, wherein the common source pillars directly contact the isolation structures.

According to an embodiment of the present invention, a method for forming a memory device comprising providing a substrate; forming a stack comprising a plurality of conductive layers and a plurality of insulating layers being alternatively stacked on the substrate; forming a plurality of memory structures on the substrate and the memory structures penetrating the stack; forming a plurality of isolation structures on the substrate and the isolation structures penetrating the stack, wherein the isolation structures dividing the memory structures into a plurality of first memory structures and a plurality of second memory structures; and forming a plurality of common source pillars on the substrate and the common source pillars penetrating the stack, wherein the common source pillars directly contact the isolation structures.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 10B is an equivalent circuit diagram illustrating a method for operating a memory cell in the memory device in accordance with one embodiment of the present invention;

FIG. 10C is an equivalent circuit diagram illustrating a method for operating a memory cell in the memory device in accordance with one embodiment of the present invention;

FIG. 10D is an equivalent circuit diagram illustrating a method for operating a memory cell in the memory device in accordance with one embodiment of the present invention;

FIG. 10E is an equivalent circuit diagram illustrating a method for operating a memory cell in the memory device in accordance with one embodiment of the present invention.

DETAILED DESCRIPTION OF THE INVENTION

Figure 1B:
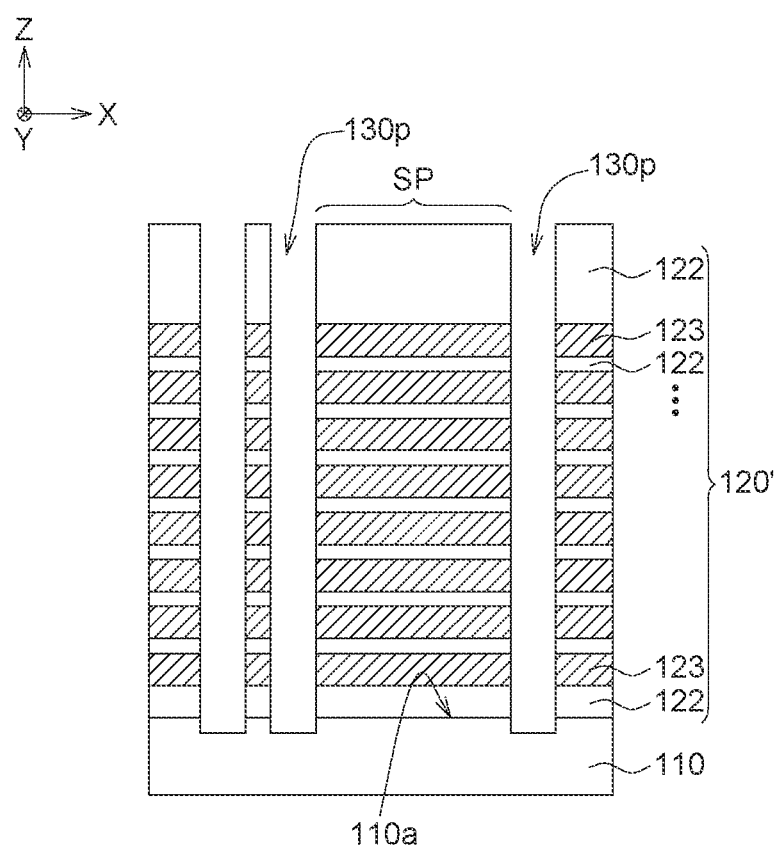
FIGS. 1A-9B are schematic diagrams illustrating a method for forming a memory device in accordance with one embodiment of the present invention.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regarded as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

FIGS. 1A-9B are schematic diagrams illustrating a method for forming a memory device 100 in accordance with one embodiment of the present invention.

FIG. 1A is a top view illustrating a method for forming a memory device 100 in accordance with one embodiment of the present invention. FIG. 1B is a cross-sectional view taken along line a-a' of FIG. 1A.

Referring to FIGS. 1A and 1B, a substrate 110 is provided. Then, a stacked body 120' is formed on a top surface 110a of the substrate 110. The stacked body 120' may comprise a plurality of insulating layers 122 and a plurality of sacrificial layers 123 alternatively stacked on the substrate 110. Next, a plurality of first openings 130p are formed on the substrate 110. Each of the first openings 130p extends along a first direction (such as the Z-orientation) and penetrates the stacked body 120' as illustrated in FIG. 1B. In the present embodiment, the first openings 130p penetrate a portion of the substrate 110, but the present invention is not limited thereto. The substrate 110 includes an array region AR and two landing regions LR adjacent to the array region AR, and the array region AR may be disposed between the landing regions LR. The first openings 130p are formed in the array region AR, and include a first group of first openings 130p1 and a second group of first openings 130p2. The first group of the first openings 130p1 and the second group of the first openings 130p2 are separated by a space SP. The Space SP can be used for forming replacement holes (illustrated in FIG. 6) in the following step.

For example, the substrate 110 is a semiconductor substrate, and may be subjected to an implantation, such as n-type implants. In the present embodiment, the insulating layer 122 may be disposed at the bottom and at the top of the stacked body 120', but the present invention is not limited thereto. The insulating layers 122 can be formed of a dielectric material such as silicon dioxide ($SiO_2$) or other suitable materials. The sacrificial layers 123 can be formed of a dielectric material such as silicon nitride or other suitable materials. The material of the insulating layers 122 may be different from that of the sacrificial layers 123. The thickness of each one of the insulating layers 122 and each one of the sacrificial layers 123 can be about 20 nm to 40 nm. In some embodiments of the present disclosure, the insulating layers 122 and the sacrificial layers 123 can be formed by a deposition process, for example, a low pressure chemical vapor deposition (LPCVD) process.

Figure 2A:
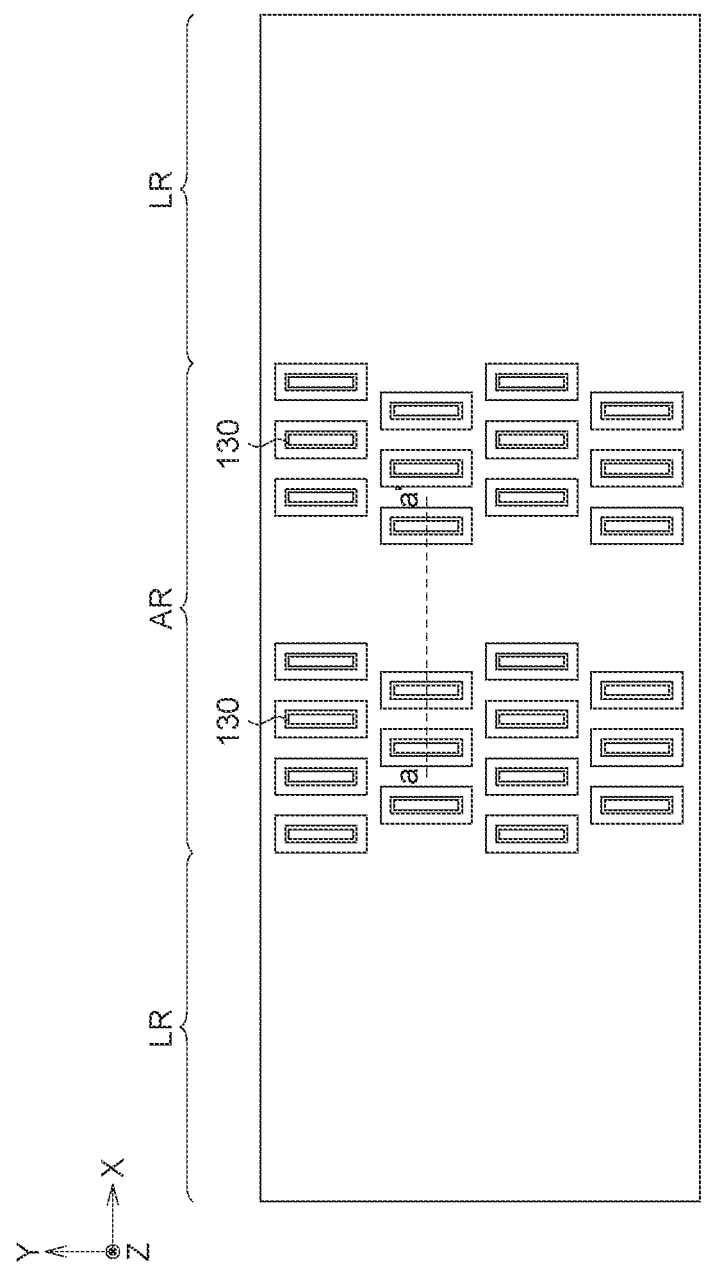
Figure 2B:
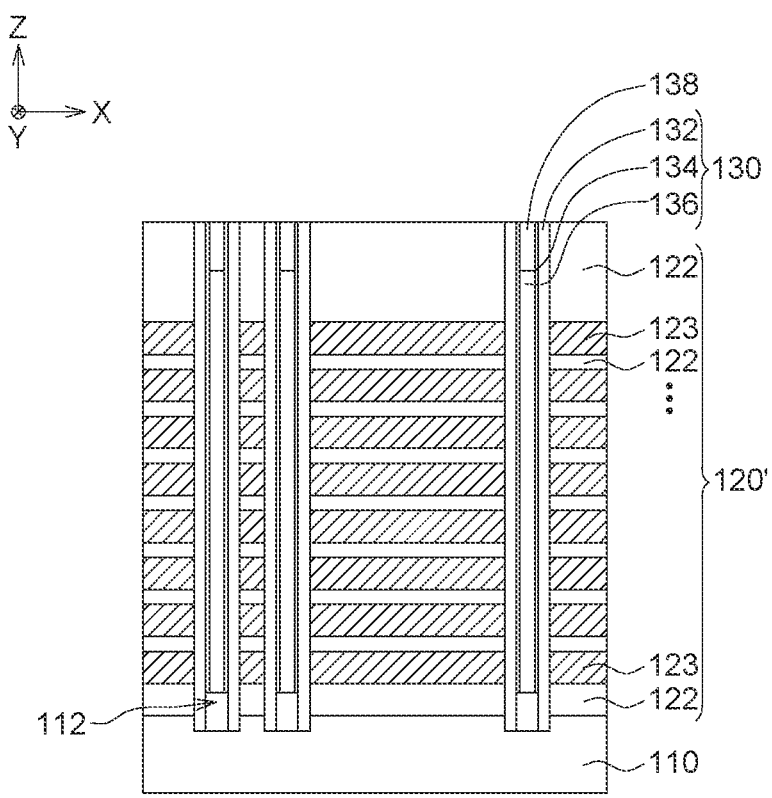

FIG. 2A is a top view illustrating the result after a plurality of memory structures 130 are formed in the structure depicted in FIG. 1A. FIG. 2B is a cross-sectional view taken along line a-a' of FIG. 2A.

Referring to FIGS. 2A and 2B, a plurality of memory structures 130 are formed in the first openings 130p. Next, a plurality of contact structures 138 are formed on the memory structures 130.

In the present embodiment, the memory structures 130 are formed on the substrate 110 and penetrating the stacked body 120' along a first direction (such as the Z-orientation) as illustrated in FIG. 2B. Each of the memory structures 130 may comprise a memory material layer 132 formed on a sidewall of one first openings 130p; a channel layer 134 formed on the memory material layer 132; and a dielectric pillar 136 formed on the channel layer 134. That is, the memory material layer 132 may be formed on and contacting the insulating layers 122 and the sacrificial layers 123. In one embodiment, the memory material layer 132 may be formed of a composite layer (i.e., an ONO layer) including a silicon oxide layer, a silicon nitride layer, and a silicon oxide layer, by a LPCVD process. However, the structure of the memory material layer 120 is not limited to this regards. In some embodiments, the memory material layer 132 may be selected from a group consisting of an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure. In some embodiments, the channel layer 134 may comprise silicon, poly silicon or other suitable material. The dielectric pillar 136 may comprise a dielectric material, such as silicon oxide ($SiO_2$).

In some embodiments, a plurality of epitaxial structures 112 may be formed on the substrate 110 along a first direction (such as the Z-orientation) as illustrated in FIG. 2B. Each of the epitaxial structures 112 may be surrounded by the memory material layer 132. The epitaxial structures 112 may be disposed between the substrate 110 and the memory structures 130.

Figure 3A:
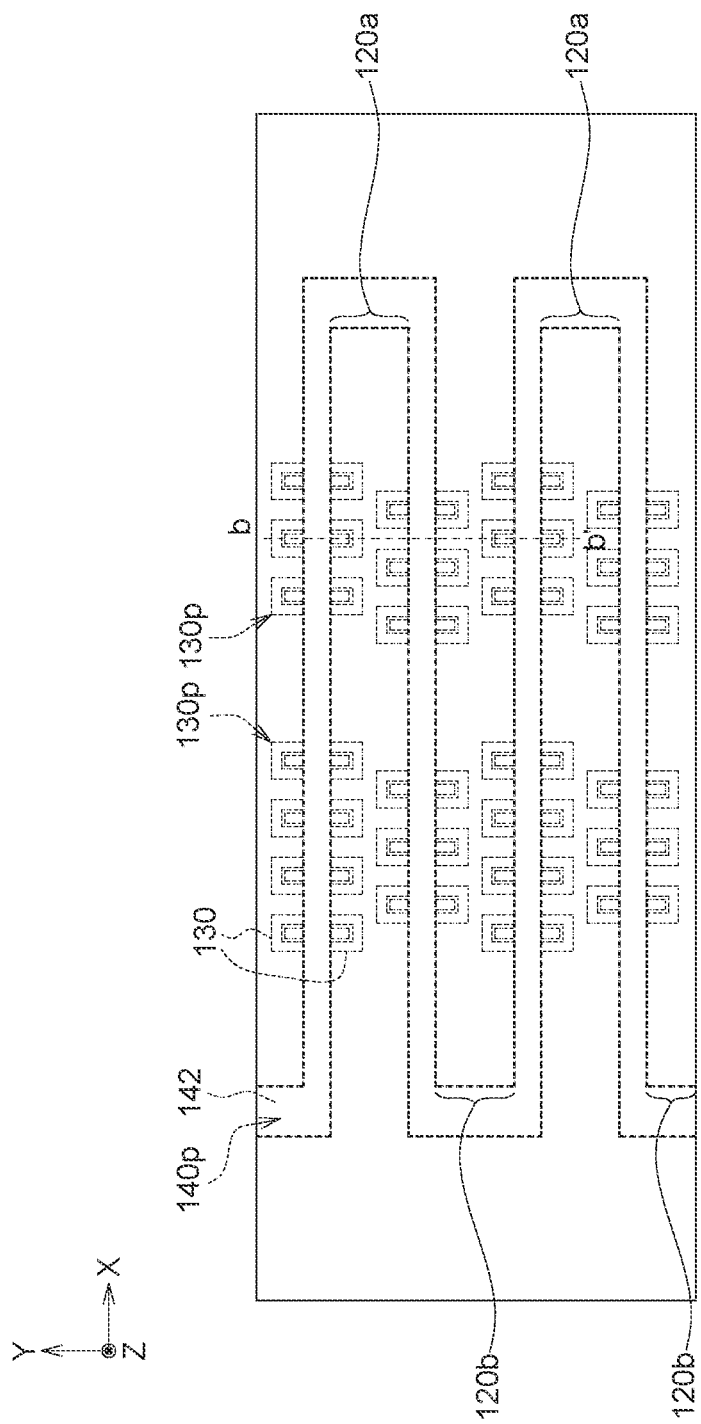
Figure 3B:
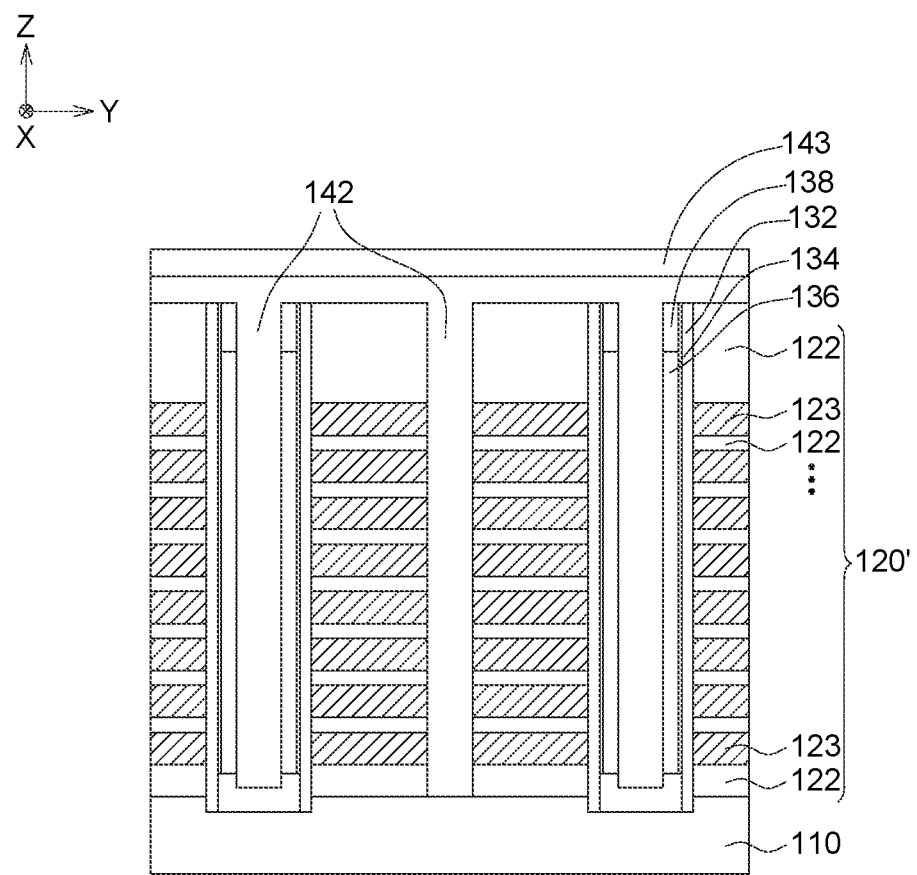

FIG. 3A is a top view illustrating the result after a second opening 140p is formed in the structure depicted in FIG. 2A. FIG. 3B is a cross-sectional view taken along line b-b' of FIG. 3A.

Referring to FIGS. 3A and 3B, the second opening 140p is formed on the substrate 110 and penetrates the stacked body 120' along a first direction (such as the Z-orientation). Then, an dielectric material 142 is filled into the second opening 140p and formed on the stacked body 120'. Thereafter, a capping layer 143 is formed on the dielectric material 142.

In the top view of FIG. 3A, portions of the second opening 140p extend along a second direction (such as Y-orientation) and portions of the second opening 140p extend along a third orientation (such as X-orientation), to divide the stacked body 120' into a plurality of first ridged shape structures 120a and a plurality of second ridged shape structures 120b. The first ridged shape structures 120a and the second ridged shape structures 120b are interlaced with each other along a direction parallel to a top surface 110a of the substrate 110 (such as a second direction (Y-orientation)). In some embodiments, the dielectric material 142 may comprise any dielectric material, such as $SiO_2$ or other suitable materials. The capping layer 143 may comprise a dielectric material, such as SiN or other suitable materials. The material of the dielectric material 142 may be different from that of the capping layer 143.

Figure 4A:
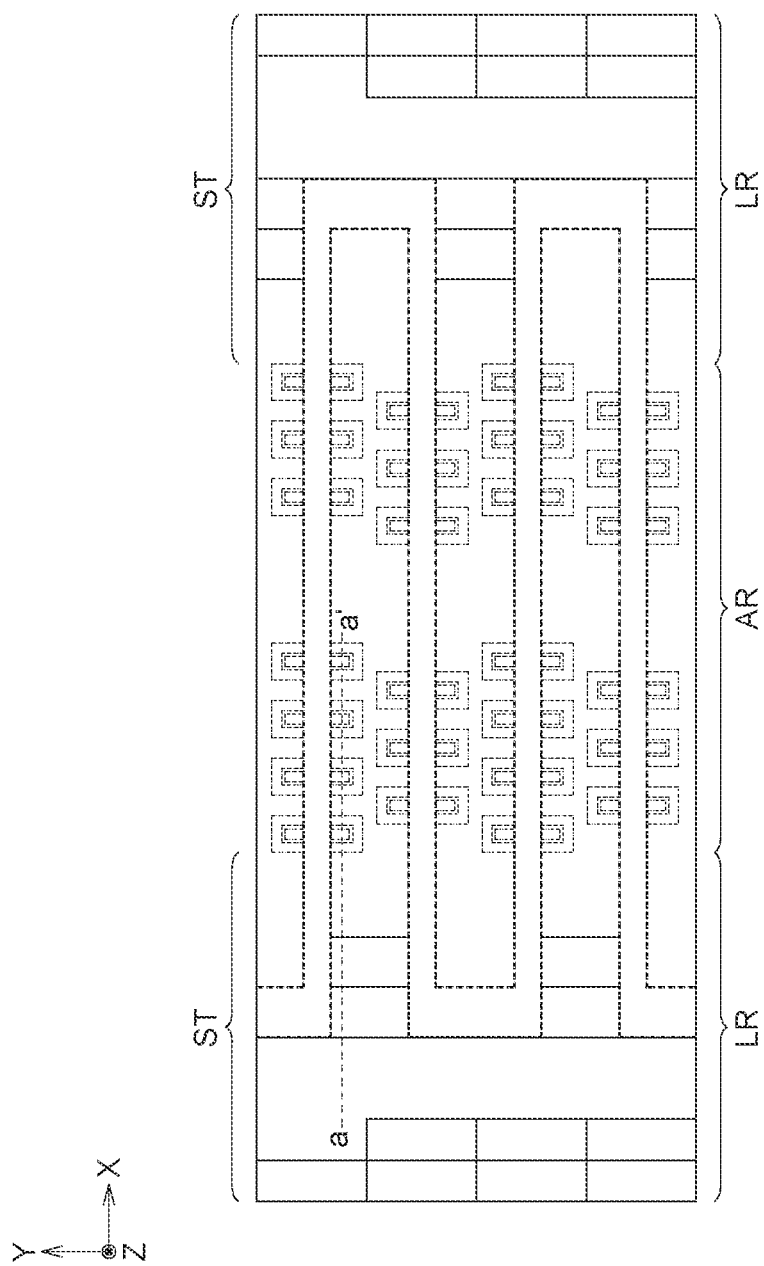
Figure 4B:
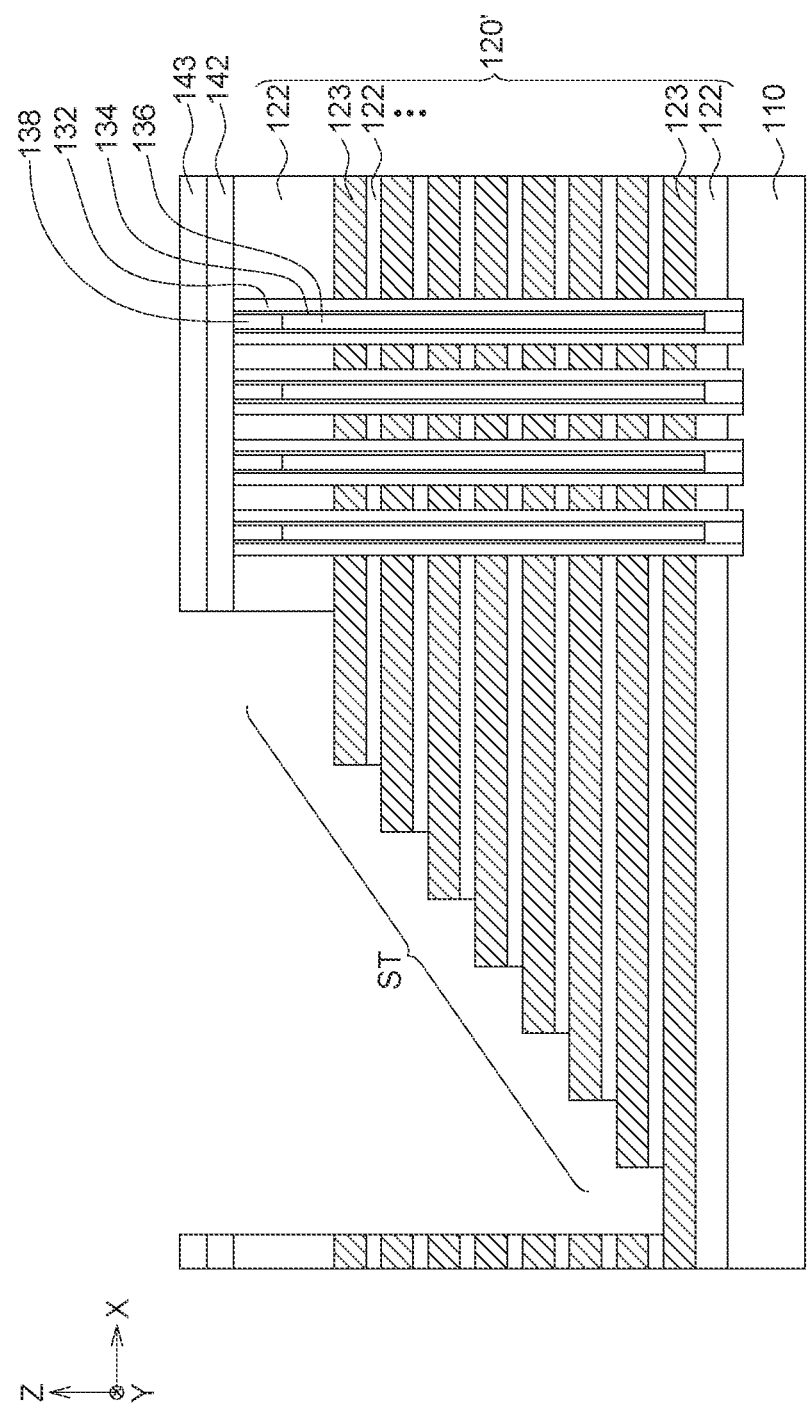

FIG. 4A is a top view illustrating the result after the staircase structures ST are formed in the structure depicted in FIG. 3A. FIG. 4B is a cross-sectional view taken along line a-a' of FIG. 4A.

Referring to FIGS. 4A and 4B, the stacked body 120' is patterned to form the staircase structures ST in the landing regions LR. The landing platforms for the string select lines and word lines may be defined in the landing regions LR. For example, some upper layers of the staircase structures ST are provided as the landing platform of the string select lines, and some lower layers of the staircase structures ST are provided as the landing platform of word lines.

Figure 5A:
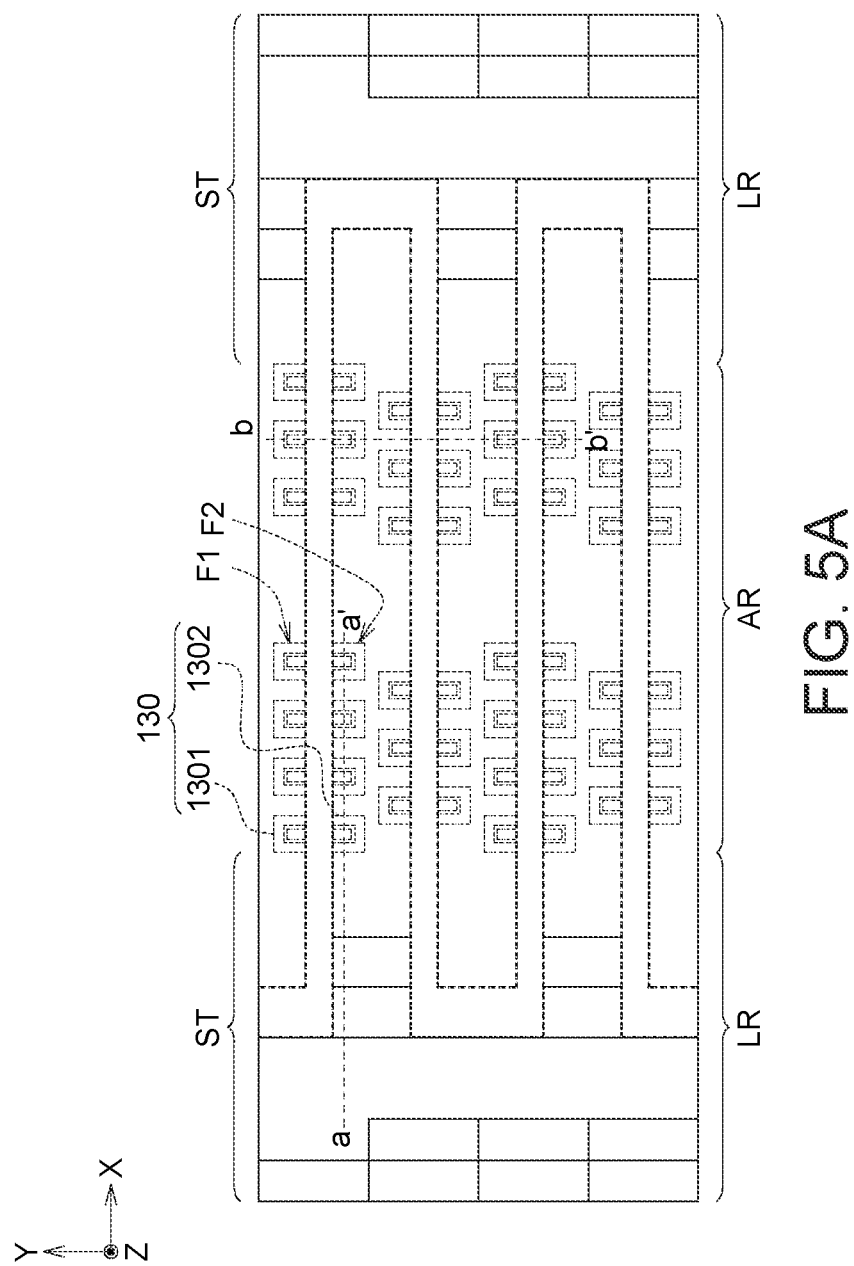
Figure 5B:
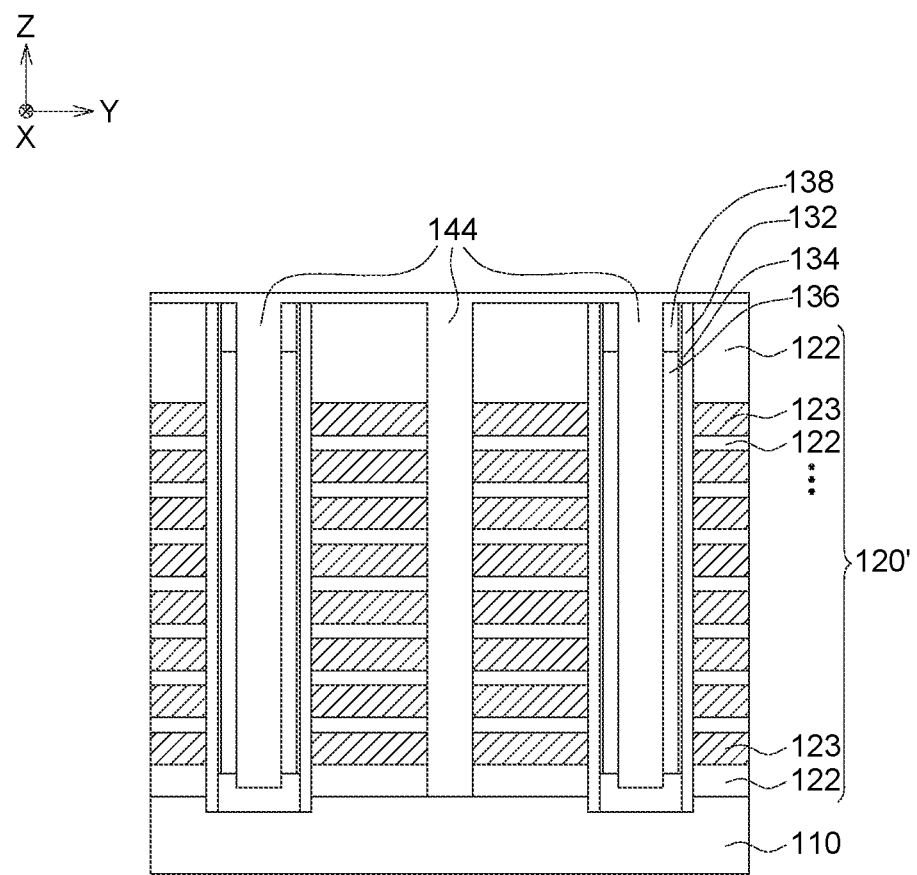
Figure 5C:
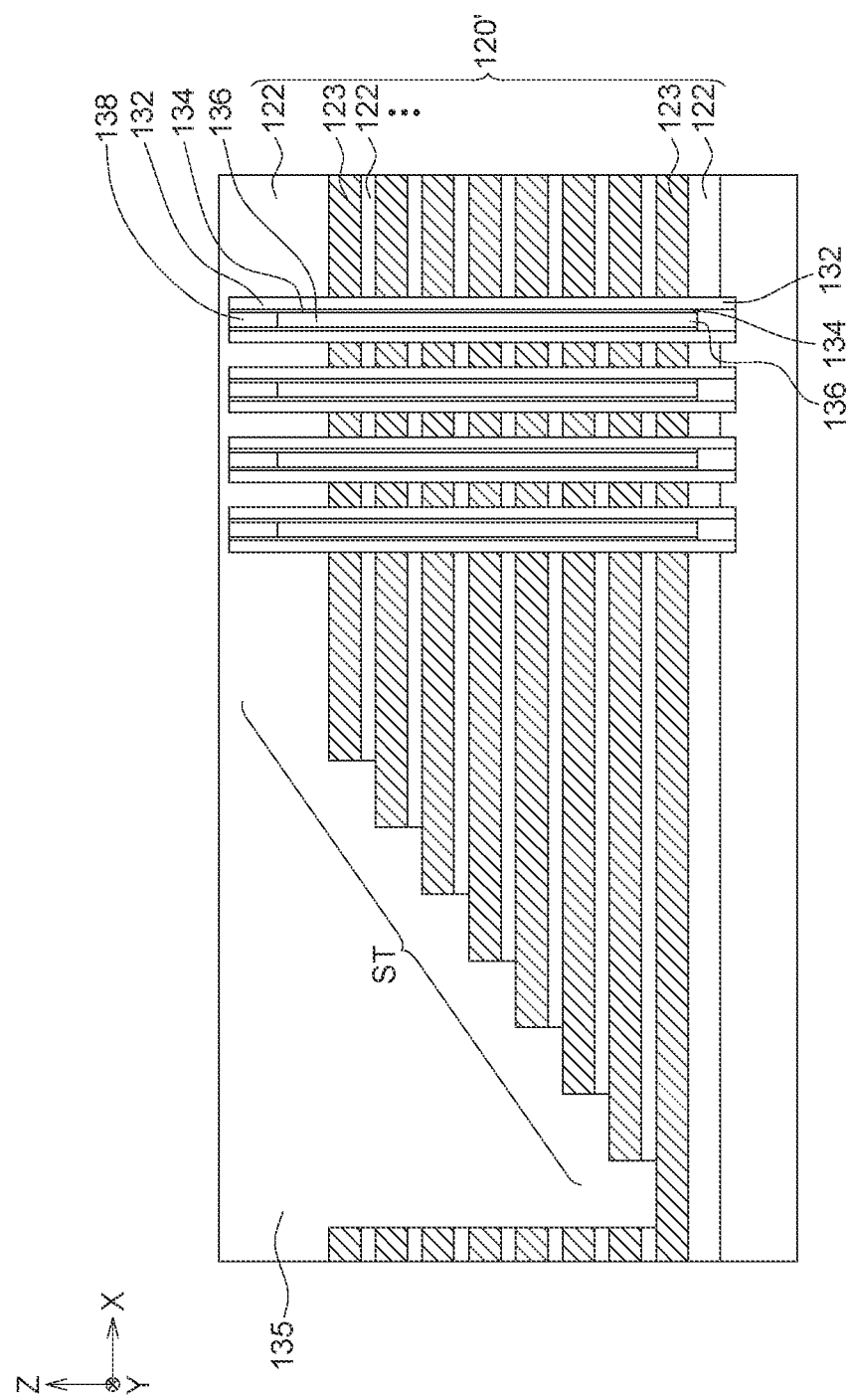

FIG. 5A is a top view illustrating the result after a planarization process is performed to the structure depicted in FIG. 4A. FIG. 5C is a cross-sectional view taken along line a-a' of FIG. 5A. FIG. 5B is a cross-sectional view taken along line b-b' of FIG. 5A.

Referring to FIGS. 5A, 5B and 5C, the dielectric material 142 and the capping layer 143 above the stacked body 120' are removed by a planarization process, such as Chemical Mechanical Polishing (CMP), and the dielectric material 142 is remained in the second opening 140p to form the isolation structure 144. A dielectric material 135 may be, for example, deposited on the staircase structures ST. The dielectric material 135 may comprise $SiO_2$ or other suitable material. The memory structures 130 may be divided into a plurality of first memory structures 1301 and a plurality of second memory structures 1302. In some embodiments, each of the memory material layer 132 of the first memory structures 1301 has a first cross section shape F1 along a second direction (such as Y-Orientation) and a third direction (X-orientation), each of the memory material layer 132 of the second memory structures 1302 has a second cross section shape F2 along a second direction (such as Y-Orientation) and a third direction (X-orientation), and the first cross section shape F1 is complementary to the second cross section shape F2, such as C or U shape.

Figure 6:
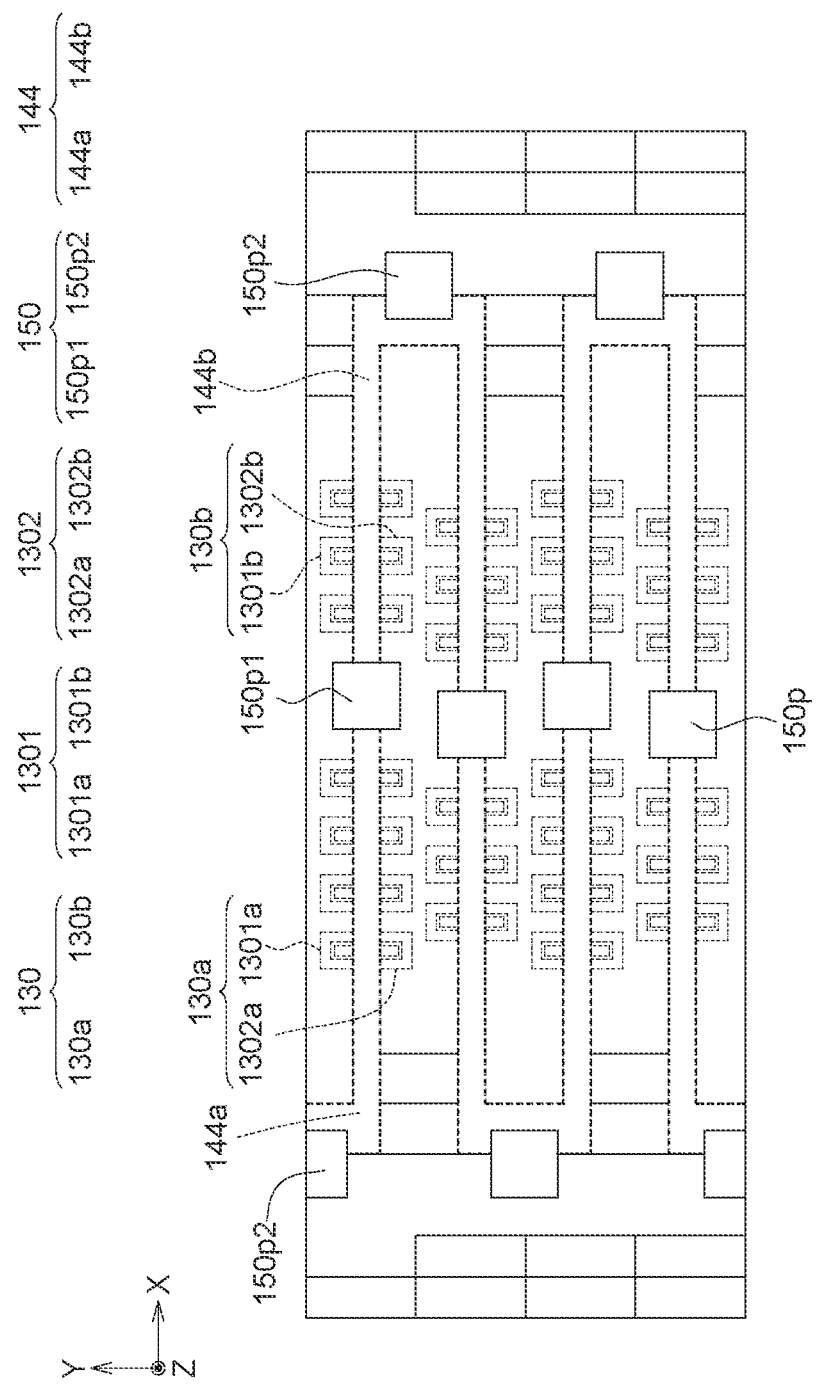

FIG. 6 is a top view illustrating the result after a plurality of replacement holes 150p are formed in the structure depicted in FIG. 5A.

Referring to FIG. 6, the replacement holes 150p are formed to penetrate the stacked body 120' along the first direction (such as Z-orientation) by, for example, an etching process. The replacement holes 150p include some first replacement holes 150p1 formed in the array region AR and some second replacement holes 150p2 formed in the landing regions LR. The memory structures 130 comprise a first group of memory structures 130a and a second group of memory structures 130b spaced from the first group of the memory structures 130a with a space SP, and the first replacement holes 150p1 are disposed in the space SP between the first group of memory structures 130a and the second group of memory structures 130b. The replacement holes 150p are connected to the second opening 140p, and the isolation structures 144 are divided into a plurality of first isolation structures 144a and a plurality of second isolation structures 144b by the first replacement holes 150p1.

The isolation structures 144 (including the first isolation structures 144a and the second isolation structures 144b) divide the memory structures 130 into a plurality of first memory structures 1301 and a plurality of second memory structures 1302. That is, each of the first group of the memory structures 130a are divided into a first memory structure 1301a and a second memory structure 1302a by one of the first isolation structures 144a, and each of the second group of the memory structures 130b are divided into a first memory structure 1301b and a second memory structures 1302b by one of the second isolation structures 144b. Each of the first isolation structures 144a and each of the second isolation structures 144b may have a U-shaped cross section along a second direction (such as Y-orientation) and a third direction (such as X-orientation). The U-shaped cross section of the first isolation structures 144a may be complementary to the U-shaped cross section of the second isolation structures 144b.

Figure 7A:
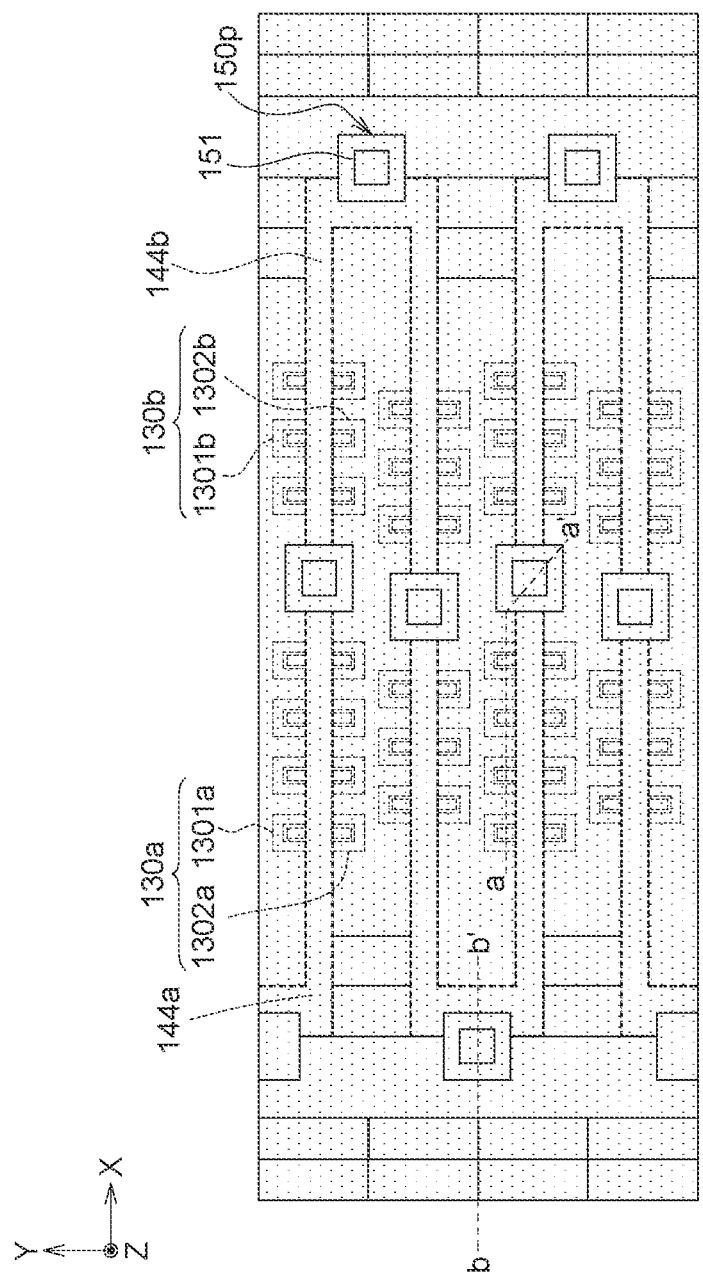
Figure 7B:
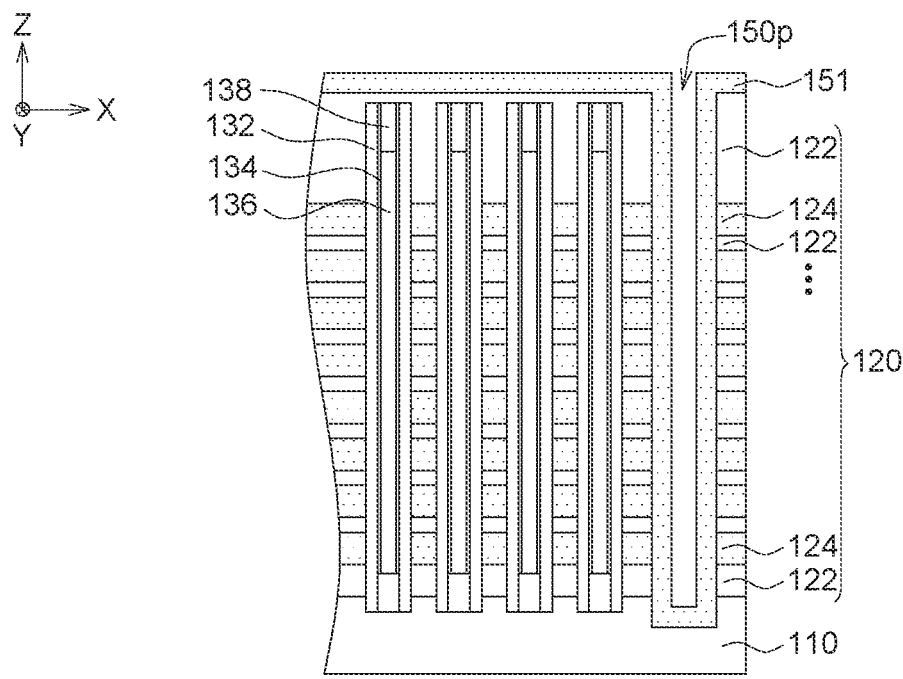
Figure 7C:
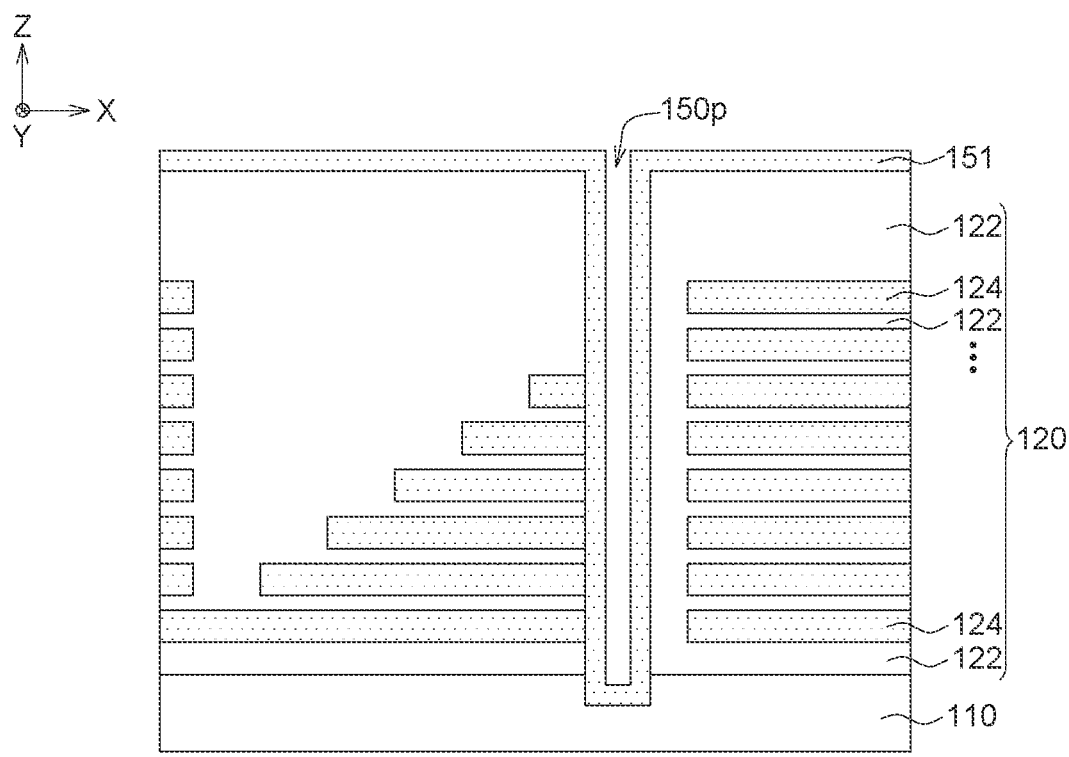

FIG. 7A is a top view illustrating the result after the sacrificial layers 123 are removed and a conductive material 151 is formed in the structure depicted in FIG. 6. FIG. 7B is a cross-sectional view taken along line a-a' of FIG. 7A. FIG. 7C is a cross-sectional view taken along line b-b' of FIG. 7A.

Referring to FIGS. 7A-7C, the sacrificial layers 123 may be removed by, for example an etching process, through the replacement holes 150p, and then a conductive material 151 is filled in the space occupied by the sacrificial layers 123 through the replacement holes 150p. The conductive material 151 also formed in the replacement holes 150p and on the insulating layer 122. For example, the conductive material 151 comprises a metal material, such as tungsten (W), aluminum (Al), titanium nitride (TiN) or other suitable material. In this way, the insulating layers 122 and the conductive layers 124 are alternatively stacked on the substrate 110 to form a stack 120. In comparison with a comparative example using the poly silicon as the conductive layers in the stack, the conductive layers 124 of the present embodiment includes metal material, the resistance can be reduced, and the problem of RC delay can be improved.

Figure 8A:
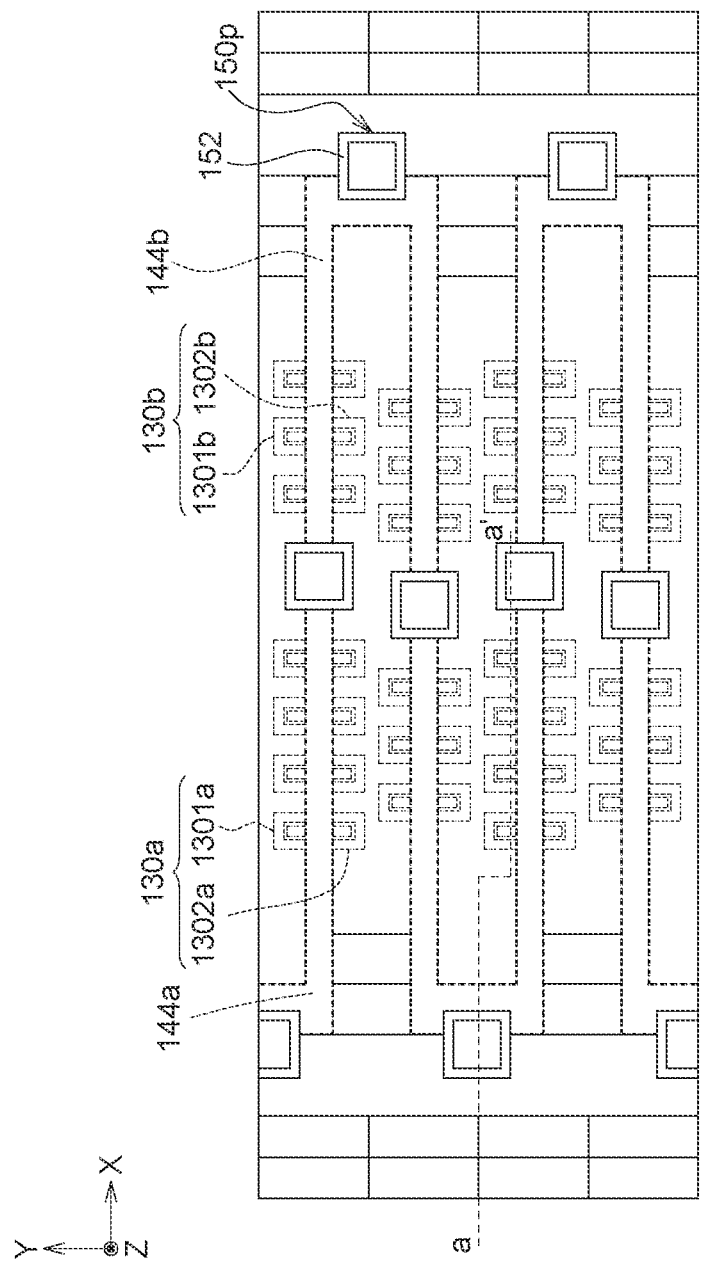
Figure 8B:
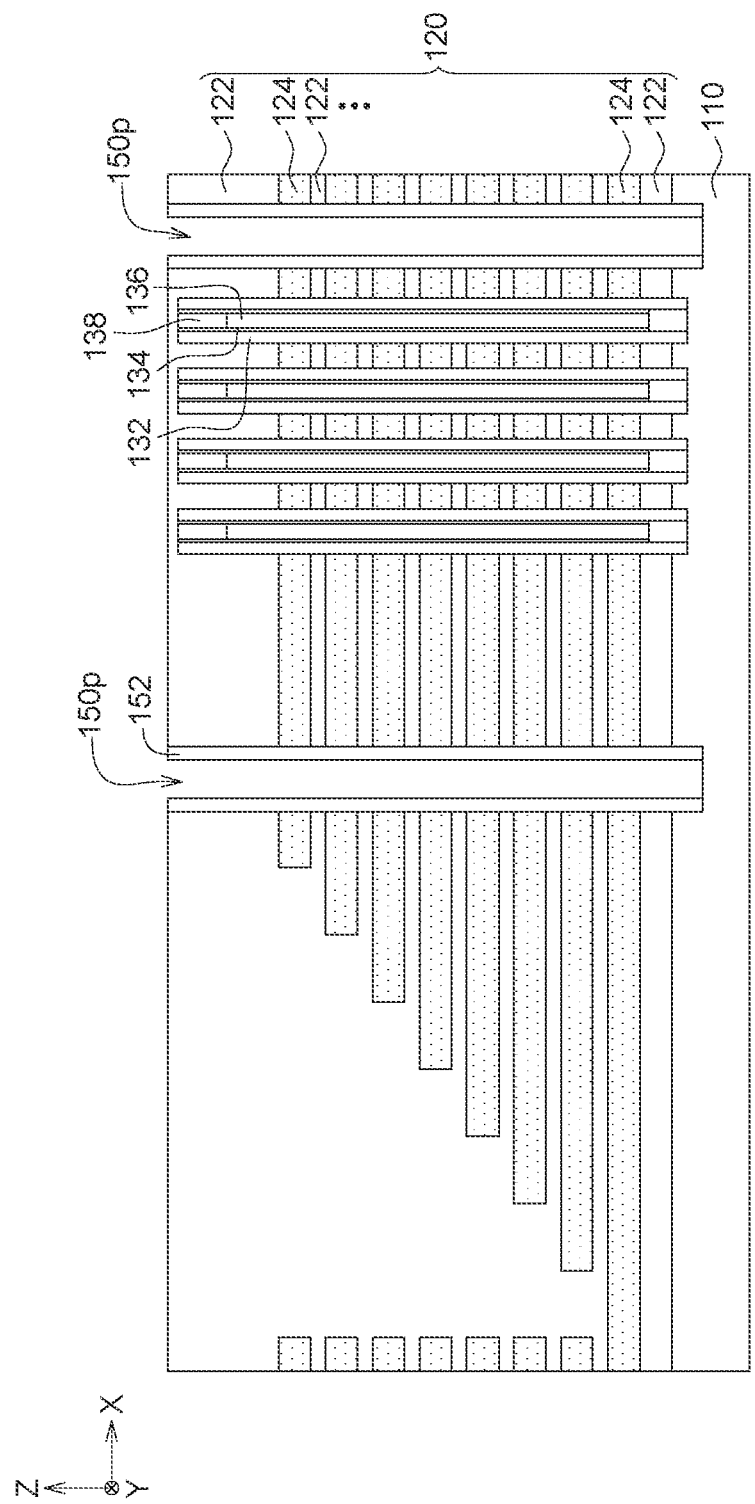

FIG. 8A is a top view illustrating the result after the conductive material 151 in the replacement holes 150p is removed and an oxide material 152 is formed in the structure depicted in FIG. 7A. FIG. 8B is a cross-sectional view taken along line a-a' of FIG. 8A.

Referring to FIGS. 8A and 8B, the conductive material 151 disposed in the replacement holes 150p and above the upper most insulating layer 122 is removed. Next, an oxide material 152 is deposited on the stack 120 and filled in the replacement holes 150p. Thereafter, a portion of the oxide material 152 is removed by, for example, an oxide etching back process, and the oxide material 152 disposed on the sidewall of the replacement holes 150p are remained.

Figure 9A:
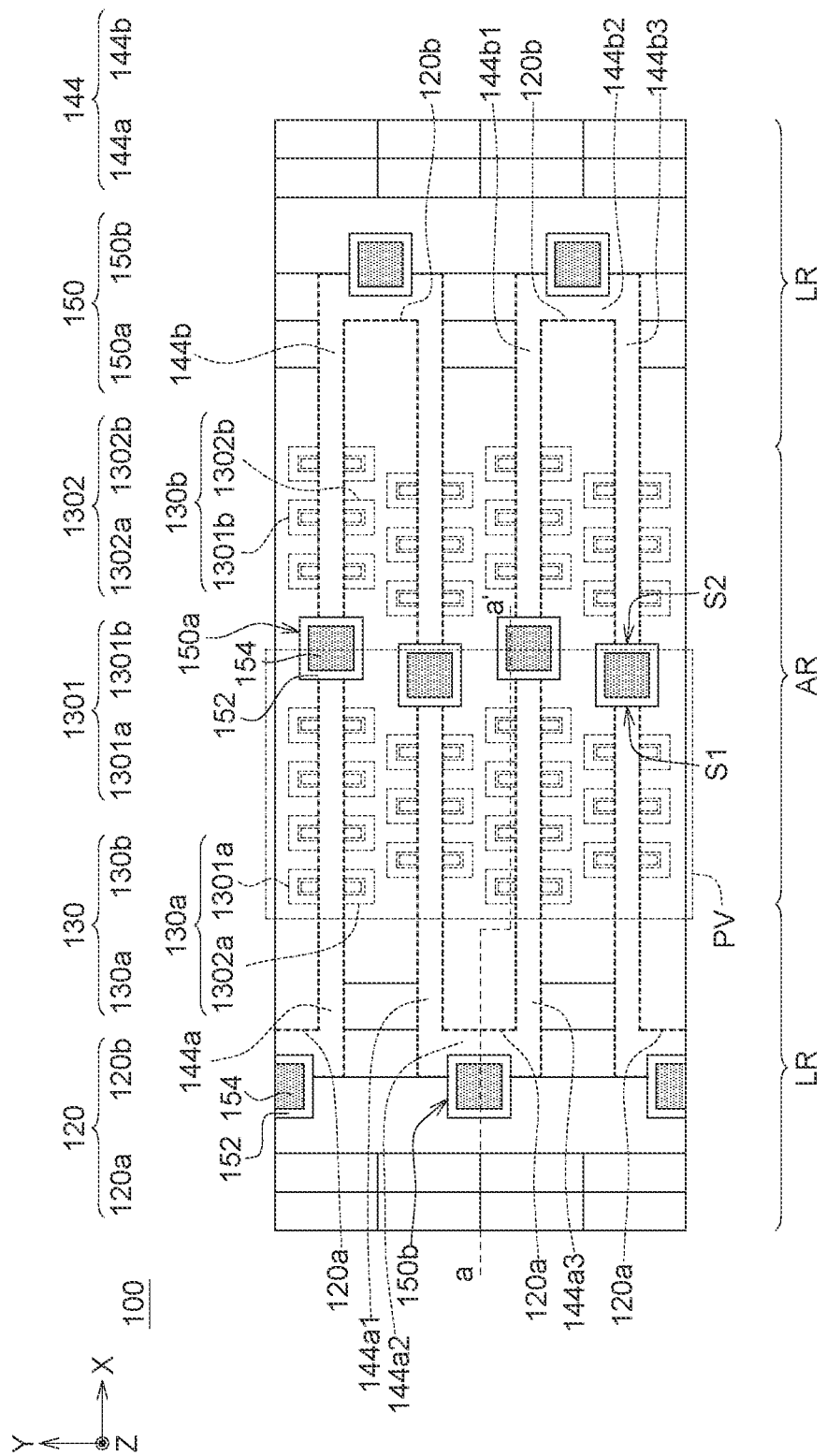
Figure 9B:
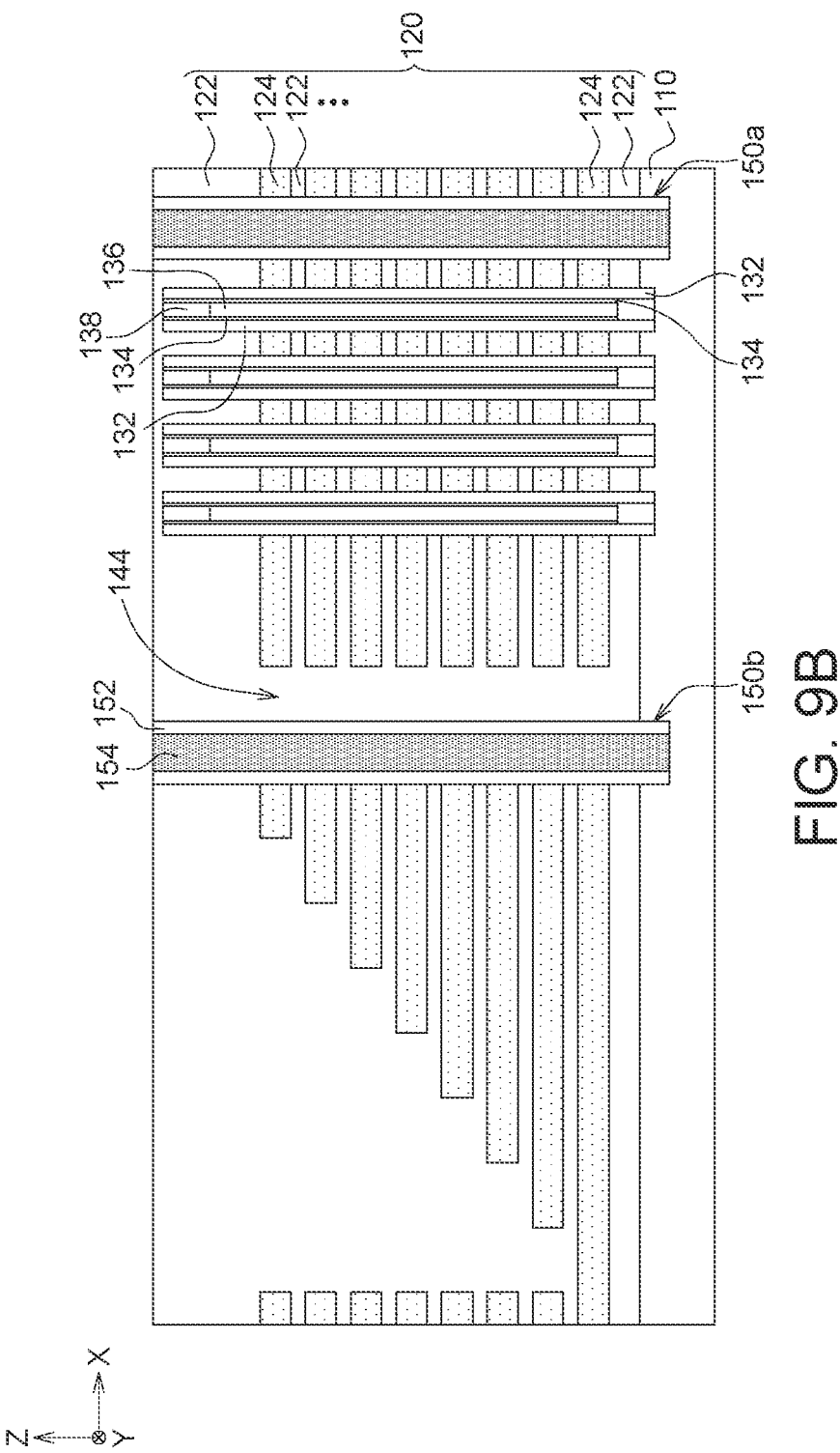

FIG. 9A is a top view illustrating the result after the conductive pillars 154 formed in the structure depicted in FIG. 8A. FIG. 9B is a cross-sectional view taken along line a-a' of FIG. 9A.

Referring to FIGS. 9A and 9B, a conductive material is filled in the replacement holes 150p to form the conductive pillar 154 in the replacement holes 150p, and each of the conductive pillars 154 is formed on and surround by the oxide material 152. In one embodiment, the material of the conductive pillar 154 can be the same as that of the conductive layer 124, but the present invention is not limited thereto. In this way, a plurality of common source pillars 150 comprising the oxide material 152 and the conductive pillars 154 are formed on the substrate 110. The conductive pillars 154 of the common source pillars 150 are electrically connected to the substrate 110. In some embodiments, a planarization process may be performed after the conductive pillars 154 are formed.

The common source pillars 150 directly contact the isolation structures 144. The first isolation structures 144a correspond to the first group of memory structures 130a, the second isolation structures 144b correspond to the second group of memory structures 130b. The common source pillars 150 include a plurality of first common source pillars 150a corresponding to the array region AR and a plurality of second common source pillars 150b corresponding to the landing regions LR. The first common source pillars 150a are disposed between the first isolation structures 144a and the second isolation structures 144b. Each of the first common source pillars 150a includes a first side S1 and a second side S2 opposite to the first side S1. One of the first isolation structures 144a directly contact the first side S1 of the first common source pillars 150a, and one of the second isolation structures 144b directly contact the second side S2 of the first common source pillars 150a.

One of the first isolation structures 144a may comprise a first portion 144a1 extending along a third direction (such as X-orientation), a second portion 144a2 extending along a second direction (such as Y-orientation) and a third portion 144a3 extending along a third direction (such as X-orientation). The second portion 144a2 is connected to and disposed between the first portion 144a1 and the third portion 144a3. The first portion 144a1 and the third portion 144a3 directly contact two neighboring first common source pillars 150a, respectively, and the second portion 144a2 directly contacts the second common source pillar 150b. One of the second isolation structures 144b may comprise a first portion 144b1 extending along a third direction (such as X-orientation), a second portion 144b2 extending along a second direction (such as Y-orientation) and a third portion 144b3 extending along a third direction (such as X-orientation). The second portion 144b2 is connected to and disposed between the first portion 144b1 and the third portion 144b3. The first portion 144b1 and the third portion 144b3 directly contact two neighboring first common source pillars 150a, respectively, and the second portion 144b2 directly contacts the second common source pillar 150b.

The stack 120 may comprise a plurality of first ridged shape structures 120a and a plurality of second ridged shape structures 120b separated by the isolation structures 144 and the common source pillars 150, and the first ridged shape structures 120a are interlaced with the second ridged shape structures 120b along a direction parallel to a top surface 110a of the substrate 110, such as Y-orientation. The first ridged shape structures 120a may include odd number word lines, and the second ridged shape structures 120b may include even number word lines. Alternatively, the first ridged shape structures 120a may include even number word lines, and the second ridged shape structures 120b may include odd number word lines. Each of the first common source pillars 150a is disposed between one of the first ridged shape structures 120a and a neighboring one of the second ridged structures 120b. The memory material layers 132 and the channel layers 134 intersect with the conductive layers 124 in each of the levels, and memory cells are formed at the intersection points, respectively.

In some embodiments, a plurality of bit lines (not shown) may be formed on the stack 120 and are electrically connected to the memory structures 130. The following process is similar or equal to the ordinary process, and it will not describe in detail.

In the present invention, since the common source pillars do not directly contact each other along a direction parallel to the top surface of the substrate, the common source pillars do not form a continuous extending structure along the second direction and the third direction, the space (P1) occupied by common source pillars in the present invention is less than (P2) that of an comparative example having common source pillars extending along the second direction or the third direction (i.e. P1<P2). Further, since the isolation structures in the present invention directly contact the common source pillars, the space for forming the memory structures can be increased in comparison with a comparative example having the isolation structures separated from the common source pillars. Therefore, in the present invention, the memory density in a unit area can be increased, the storage capacity can be increased, and the array efficiency of the present invention can be higher than that of the comparative examples having the common source pillars extending along the direction parallel to a top surface of a substrate and/or having the isolation structures separated from the common source pillars.

Figure 10A:
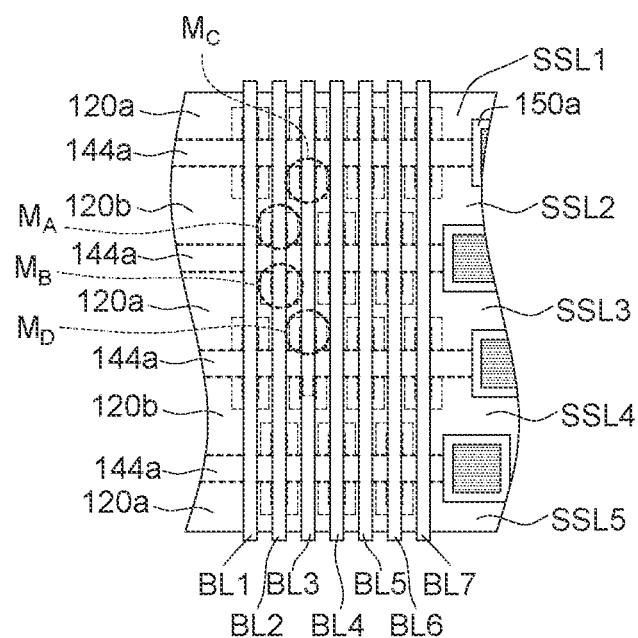
FIG. 10A is a top view illustrating a method for operating the memory device in accordance with one embodiment of the present invention.

FIG. 10A is a top view illustrating a method for operating the memory device 100. In particular, FIG. 10A illustrates a partial view corresponding to region PV of FIG. 9A. FIG. 10B is an equivalent circuit diagram illustrating a method for operating a memory cell $M_A$ in the memory device 100. FIG. 10C is an equivalent circuit diagram illustrating a method for operating a memory cell $M_B$ in the memory device 100. FIG. 10D is an equivalent circuit diagram illustrating a method for operating a memory cell $M_C$ in the memory device 100. FIG. 10E is an equivalent circuit diagram illustrating a method for operating a memory cell $M_D$ in the memory device 100.

Referring to FIGS. 10A-10E, bit lines BL1-BL7 are electrically connected to the corresponding first memory structures 1301a and the second memory structures 1302a in the first group of memory structures 130a. The stack 120 is divided into the first ridged structures 120a and the second ridged structures 120b by the isolation structures 144 and the common source pillars 150. The first memory structures 1301a and the second memory structures 1302a are separated by the first isolation structures 144a and the first common source pillars 150a directly contacting the first isolation structures 144a.

For example, FIG. 10A illustrates the method for programming the memory cell $M_A$ in the first group of memory structures 130a, but the present invention is not limited thereto. Each of the first memory structures 1301a/1301b and the second memory structures 1302a/1302b can be independently controlled, and the operation to one of memory cells of the first memory structures 1301a/1301b and the second memory structures 1302a/1302b can be read, erase, programming or inhibition. Referring to FIGS. 10B-10E, one ground select line GSL, two word lines WL stacked on the ground select line GSL and one string select line SSL stacked on the word lines WL are exemplarily illustrated, but the number of the ground select line GSL, the word line WL and the string select line SSL are not limited thereto.

In the present embodiment, the 0V is applied to the bit line BL2 corresponding to the memory cell $M_A$, and the $V_{CC}$ is applied to the bit lines BL1 and BL3-BL7. The $V_{CC}$ is applied to the string select line SSL2 corresponding to the memory cell $M_A$, and the 0V is applied to other string select lines SSL1 and SSL3-SSL5. The Vpass is applied to the upper word lines WL, and the $V_{PGM}$ is applied to the lower word lines WL. The 0V is applied to the ground select lines GSL. In this way, the memory cell $M_A$ can be programmed, and the memory cells $M_B$, $M_C$ and $M_D$ can be inhibited.

Since the first memory structures 1301 and the second memory structures 1302 are separated by the isolation structure 144 and the common source pillars 150, the string select lines SSL, the word lines WL and the ground select lines GSL corresponding to first memory structures 1301 and the second memory structures 1302 can be independently controlled.

In one experimental example, a memory device has no replacement holes in the array region, and has an array efficiency of 100%. In some embodiments of the present invention, the area of the replacement holes (for forming the common source pillars) is twice as the area of the first openings (for forming the memory structure), the number of the first openings to the number of the replacement holes can be 5:1 or 8:1, and the array efficiency of the memory device can be 71% or 80% in comparison with the experimental example. In other words, the memory device of the present invention still can keep good array efficiency even though having replacement holes in the array region.

According to embodiments described above, a memory device and a method for forming the same are provided in the present invention. The memory device at least comprises a substrate; a stack comprising a plurality of conductive layers and a plurality of insulating layers being alternatively stacked on the substrate; a plurality of memory structures formed on the substrate and penetrating the stack; a plurality of isolation structures formed on the substrate and penetrating the stack, wherein the isolation structures dividing the memory structures into a plurality of first memory structures and a plurality of second memory structures; and a plurality of common source pillars formed on the substrate and penetrating the stack, wherein the common source pillars directly contact the isolation structures.

Since the memory device includes the isolation structures and the common source pillar directly contacting the isolation structures, the string select lines, the word lines and the ground select lines corresponding to first memory structures and the second memory structures can be independently controlled, for example, each of memory strings in Hemi-cylindrical vertical channel (HCVC) memory device can be independently controlled. Moreover, in comparison with the comparative examples having the common source pillars continuously extending along the direction parallel to a top surface of a substrate and/or having the isolation structures separated from the common source pillars, the memory device one embodiment of present invention includes the common source pillars separated from each other along the direction parallel to the top surface of the substrate, and the isolation structures directly contacting the common source pillars, the memory density in a unit area can be increased, the storage capacity can be increased, and the array efficiency can be higher. Further, the conductive layers in the stack can include metal material having a lower resistance in comparison with poly silicon material. When the conductive layers in the stack includes metal material, the resistance produced in the memory device can be reduced comparing to the comparative example using the poly silicon as the conductive layers in the stack, the problem of RC delay in the memory device can be improved, and the performance of the memory device can be enhanced while remaining the small size and high memory density.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a memory device, comprising:
   providing a substrate;
   forming a stack comprising a plurality of conductive layers and a plurality of insulating layers being alternatively stacked on the substrate;
   forming a plurality of memory structures on the substrate and the memory structures penetrating the stack;
   forming a plurality of isolation structures on the substrate and the isolation structures penetrating the stack, wherein the isolation structures divide the memory structures into a plurality of first memory structures and a plurality of second memory structures; and
   forming a plurality of common source pillars on the substrate and the common source pillars penetrating the stack, wherein the common source pillars directly contact the isolation structures, wherein the stack comprises a plurality of first ridged shape structures and a plurality of second ridged shape structures separated by the isolation structures and the common source pillars, and the first ridged shape structures are interlaced with the second ridged shape structures along a direction parallel to a top surface of the substrate.

2. The method according to claim 1, further comprising:
   forming a stacked body comprising a plurality of sacrificial layers and the insulating layers alternatively stacked on the substrate;
   forming a plurality of first openings penetrating the stacked body;
   forming the memory structures in the first openings;
   forming a second opening penetrating the stacked body, the second opening connecting the first openings and dividing the memory structures into the first memory structures and the second memory structures;
   forming the isolation structures in the second opening;
   forming a plurality of replacement holes penetrating the stacked body;
   removing the sacrificial layers;
   filling a conductive material into spaces left from the sacrificial layers to form the conductive layers alternatively stacked with the insulating layers; and
   forming the common source pillars into the replacement holes.

3. The method according to claim 2, wherein the step of forming each of the first memory structures and each of the second memory structures comprises:
   forming a memory material layer on the sacrificial layers and the insulating layers; and
   forming a channel layer on the memory material layer.

4. The method according to claim 1, further comprising forming a plurality of contact structures, wherein each of the contact structures is electrically connected to one of the first memory structures or one of the second memory structures.

5. The method according to claim 1, wherein the step of forming each of the common source pillars comprises:
   depositing an oxide material on the conductive layers; and
   forming a conductive pillar on the oxide material, wherein the conductive pillar is electrically connected to the substrate.

6. The method according to claim 1, wherein the substrate comprises an array region and a landing region adjacent to the array region, the memory structures are disposed in the array region, and the conductive layers include a metal material.

7. The method according to claim 6, wherein the memory structures comprise a first group of memory structures and a second group of memory structures spaced from the first group of memory structures, the common source pillars comprises a plurality of first common source pillars disposed in the array region and a plurality of second common source pillars disposed in the landing region, and the first common source pillars are disposed between the first group of memory structures and the second group of memory structures.

8. The method according to claim 7, wherein the isolation structures comprise a plurality of first isolation structures and a plurality of second isolation structures, the first isolation structures correspond to the first group of memory structures, the second isolation structures correspond to the second group of memory structures, and the first common source pillars are disposed between the first isolation structures and the second isolation structures.

9. The method according to claim 8, wherein each of the first isolation structures directly contacts a first side of the first common source pillars, each of the second isolation structures directly contact a second side of the first common source pillars, and the first side is opposite to the second side.

* * * * *